United States Patent [19]
Hirose et al.

[11] Patent Number: 5,898,218
[45] Date of Patent: Apr. 27, 1999

[54] STRUCTURE FOR MOUNTING ELECTRONIC COMPONENTS AND METHOD FOR MOUNTING THE SAME

[75] Inventors: Shinichi Hirose, Okazaki; Naohito Mizuno, Kariya, both of Japan

[73] Assignee: Denso Corporation, Kariya, Japan

[21] Appl. No.: 08/840,073

[22] Filed: Apr. 24, 1997

[30] Foreign Application Priority Data

Apr. 26, 1996 [JP] Japan ................................. 8-106995
Mar. 24, 1997 [JP] Japan ................................. 9-069933

[51] Int. Cl.⁶ ........................... H01L 23/10; H01L 23/48; H01L 23/06
[52] U.S. Cl. ........................... 257/710; 257/693; 257/703; 257/678
[58] Field of Search .................... 257/693, 729, 257/710, 702–704, 678, 689, 699, 701

[56] References Cited

U.S. PATENT DOCUMENTS

| 4,835,067 | 5/1989 | Levine | 257/701 |
| 5,503,016 | 4/1996 | Koen | 73/493 |
| 5,554,806 | 9/1996 | Mizuno et al. | 73/493 |
| 5,747,874 | 5/1998 | Seki et al. | 257/692 |

FOREIGN PATENT DOCUMENTS 631 461 12/1994 European Pat. Off.
63-194350 2/1988 Japan ................................. 257/700
2-72654 3/1990 Japan ................................. 257/693

OTHER PUBLICATIONS

Sae Technical Paper Series 951018 "New Accelerometer Bsed on Innovative Packaging and Circuit Design" Diederik W. de Bruin et al, Feb. 27–Mar. 2, 1995 pp. 1–5.
Japan Metallurgical Engineering Society Report Vol. 23, No. 12, Issued in 1984. p. 1006.

*Primary Examiner*—Mahshid Saadat
*Assistant Examiner*—Jhihan B Clark
*Attorney, Agent, or Firm*—Pillsbury Madison & Sutro LLP

[57] ABSTRACT

A semiconductor sensor chip such as an acceleration sensor chip and other electronic components such as controlling semiconductor chips are mounted on and connected to conductor patterns formed on a ceramic package. The ceramic package is heated together with a cap to hermetically seal the ceramic package containing the sensor chip and electronic components therein. The conductor pattern formed on the ceramic package is composed of a base film of, i.e., tungsten, an intermediate film of nickel plated on the base film and a thin surface film of gold which is formed on the intermediate film by flash plating. The conductor patterns are also formed at outside portions of the ceramic package. The ceramic package is mounted on a printed board by soldering at portions where the conductor patterns are formed. Though the surface gold film is thin and made at a low cost, it provides an excellent surface of the conductor patterns for securing a good solder wettability and bonding quality.

26 Claims, 8 Drawing Sheets

STRUCTURE FOR MOUNTING ELECTRONIC COMPONENTS AND METHOD FOR MOUNTING THE SAME

CROSS-REFERENCE TO RELATED APPLICATIONS

This application is based upon and claims benefit of priority of Japanese Patent Applications No. Hei-8-106995 filed on Apr. 26, 1996 and No. Hei-9-69933 filed on Mar. 24, 1997, the contents of which are incorporated herein by reference.

BACKGROUND OF THE INVENTION

1. Field of the Invention

The present invention relates to a structure for mounting electronic components and a method for assembling and mounting the electronic components, and more particularly to a structure which includes a housing for mounting electronic components therein and is subjected to a heating process after the electronic components are mounted on the housing.

2. Description of Related Art

Units having this kind of structure include the following electronic modules containing a semiconductor sensor and a controlling IC therein, such as an acceleration sensor module for use in an antilock brake system or an air bag system, a semiconductor pressure sensor module used for detecting suction pressure or atmospheric pressure, a high pressure sensor module used in an air conditioning system, and the like all of the models are used in an automobile. A sensor module of this kind is usually packaged in a metal can having connecting pins for mounting it on a substrate. Mounting the can package on the substrate, however, requires some mounting components, and a structure of the canned module itself tends to be complicated. Therefore, a ceramic package structure has been proposed and used to some extent. Semiconductor sensors and other control elements are on the ceramic package and hermetically sealed therein. The following features are required for surface-mounting components on the ceramic package: securing a bonding strength of bonding wires connecting the components, ensuring reliability of electrical and mechanical connections, obtaining sufficient wettability of solder, and secure reliability of soldered portions.

Considering these requirements, the ceramic package, in which, for example, a tungsten (W) film is formed on a ceramic substrate as a thick film conductor, and, on the tungsten thick film, a nickel-boron (Ni—B) film having a thickness of about 1 $\mu$m, a nickel-phosphorus (Ni—P) film having a thickness of about 2 $\mu$m and a thick gold (Au) film having a thickness of about 1 $\mu$m are plated in this order, has been dominantly used hitherto. Here, the Ni—B plating means a Ni plating in which B is used as a catalyst and the Ni—P plating means a Ni plating in which P is used as a catalyst. Though the film structure of this kind is able to secure the bonding strength and the wettability, reliability of soldering on the Au plating is not secured. This is because the Au atoms diffuse into a solder material during a soldering process, creating voids called Kirkendall voids in the Au film. In addition, the plating cost of the thick Au film is high.

Though, in case a chip condenser is mounted on a package, solder or epoxy-type silver (Ag) paste is customarily used, the solder cannot be used in the ceramic package which is subjected to a heat treatment at a temperature higher than 300° C. to seal the package after the chip condenser is mounted. Also, a silicone-type bonding material is customarily used for die-bonding a sensor chip because a bonding material having low stress characteristics is required for this purpose. There is a problem, however, that bonding materials can not be hardened adequately when the silicone-type material is used together with the epoxy-type material at the same time.

SUMMARY OF THE INVENTION

The present invention has been made in view of the above-mentioned problems, and an object of the present invention is to provide a structure including a ceramic package for mounting electronic components thereon in which the electronic components are securely bonded both electrically and mechanically on conductor patterns formed on the ceramic package more particularly, an object of the present invention is to provide a sensor module such as an acceleration sensor module packaged in a ceramic housing which is subjected to a heat treatment at a high temperature after the electronic components are mounted on the ceramic housing. Another object of the present invention is to provide a method for mounting electronic components securely on the ceramic package with high reliability.

The conductor patterns formed on the ceramic package on which the electronic components are mounted, bonded and/or connected must have following features: bonding wires have to be securely bonded thereon, electronic components have to be mechanically and/or electrically bonded thereon with high reliability, and a good solder wettability thereon has to be secured to obtain a high strength of soldering. The present invention provides such conductor patterns which fulfill the requirements mentioned above.

According to the present invention, the conductor patterns are composed of a base film of such as tungsten printed on the ceramic package which constitutes a housing for the electronic components, an intermediate film of nickel plated on the base film, and a surface film of gold formed on the intermediate film by flash plating. As opposed to the conventional gold surface film of this kind which is formed by thick plating, the gold surface film of the present invention is formed by the flash plating with a thickness much thinner than that of the conventional film. It has been discovered that if the thickness of the flash plated gold film is more than 0.07 $\mu$m, sufficient solder wettability for good soldering can be attained. The thin gold surface film formed by the flash plating is, of course, made with a lower cost compared with the thick film formed by thick plating. Preferably, the thickness of the gold surface film is formed not to exceed 0.3 $\mu$m, so that the gold surface film does not completely cover the intermediate nickel film. Also, the gold surface film having a thickness not exceeding 0.3 $\mu$m helps to avoid formation of Kirkendall voids in the surface film in a soldering process.

The intermediate film of nickel is plated with a thickness more than 4 $\mu$m on the base film of tungsten according to the present invention. Even when a base film surface is rough, the intermediate film of nickel having this thickness provides a substantially flat surface on which the thin gold film is formed by flash plating. The conductor pattern having a substantially flat surface thus made secures a high strength of wire bonding thereon.

The material of the base film, tungsten may be replaced by molybdenum. Though molybdenum is more expensive than tungsten, it has some advantages over tungsten. When molybdenum is used as a base film material, green ceramic sheets on which the base film is printed can be fired at a lower temperature compared with a temperature when tungsten is used. Also, electric resistance of wiring is lower when molybdenum is used. Tungsten may also be replaced by copper or silver. When copper is used as the material of the base film, the thickness of the intermediate film of nickel can be made thinner because the plated surface of copper is smoother than that of tungsten. When silver is used in place of tungsten, the intermediate film can be eliminated because the silver surface can be made smooth enough to flash plate the thin gold film directly thereon.

The present invention also provides a structure in which silicone-type silver paste is used for connecting certain components which require to be connected both electrically and mechanically to the conductor pattern.

The ceramic package is manufactured by laminating and firing separate green sheets on which the base film is printed. Then, the intermediate film is plated on the base film and the gold surface film is formed on the intermediate film by flash plating. Thus, the conductor patterns are formed on the ceramic package. The electronic components are mounted on the conductor patterns with bonding materials. Then, the components are electrically connected to each other and to the conductor patterns by wire bonding. Thereafter, the bonding materials are hardened. Finally, a cap is placed on the ceramic package together with a sealing material to close a cavity in which the electronic components are contained. The ceramic package is heated together with the cap to cure the sealing material. Thus, the sensor module is completed. The sensor module is mounted on and connected to a printed board by soldering at outside portions of the ceramic package where the conductor patterns are formed.

Other objects and features of the present invention will become more readily apparent from a better understanding of the preferred embodiment described below with reference to the following drawings.

DETAILED DESCRIPTION OF THE PREFERRED EMBODIMENTS

A first embodiment according to the present invention will be described, referring to accompanying drawings, FIGS. 1 to 12.

Figure 1:
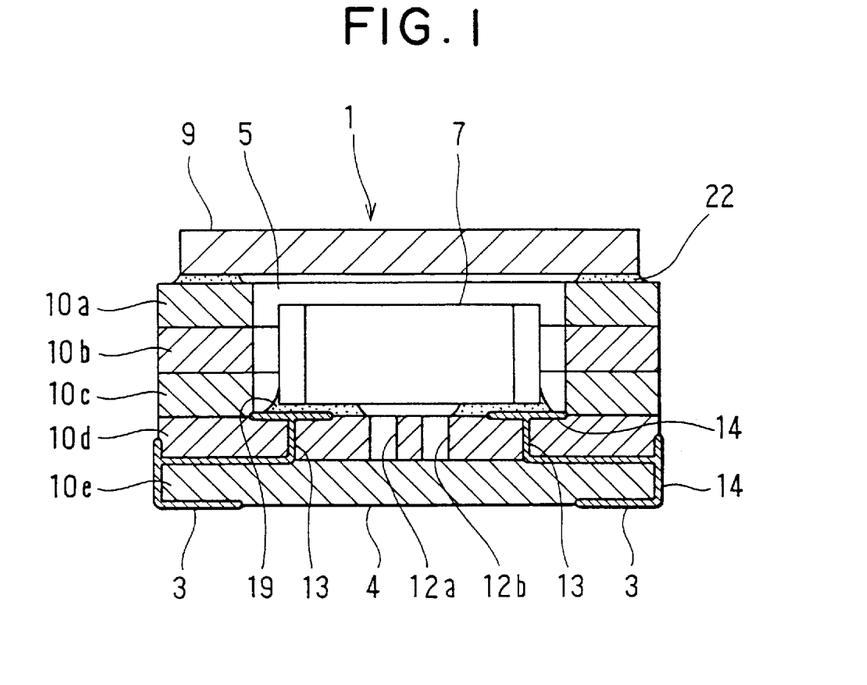
FIG. 1 shows cross-sectional view of an acceleration sensor module according to the present invention.
Figure 2:
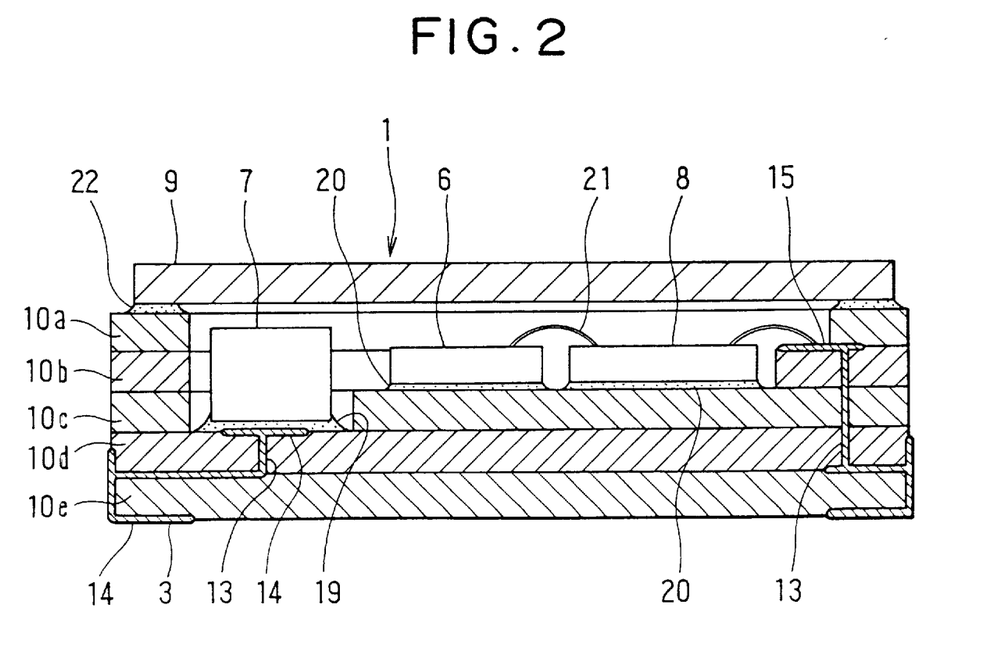
FIG. 2 shows another cross-sectional view, showing a cross-section perpendicular to the cross-section of FIG. 1, of the acceleration sensor module according to the present invention.
Figure 3:
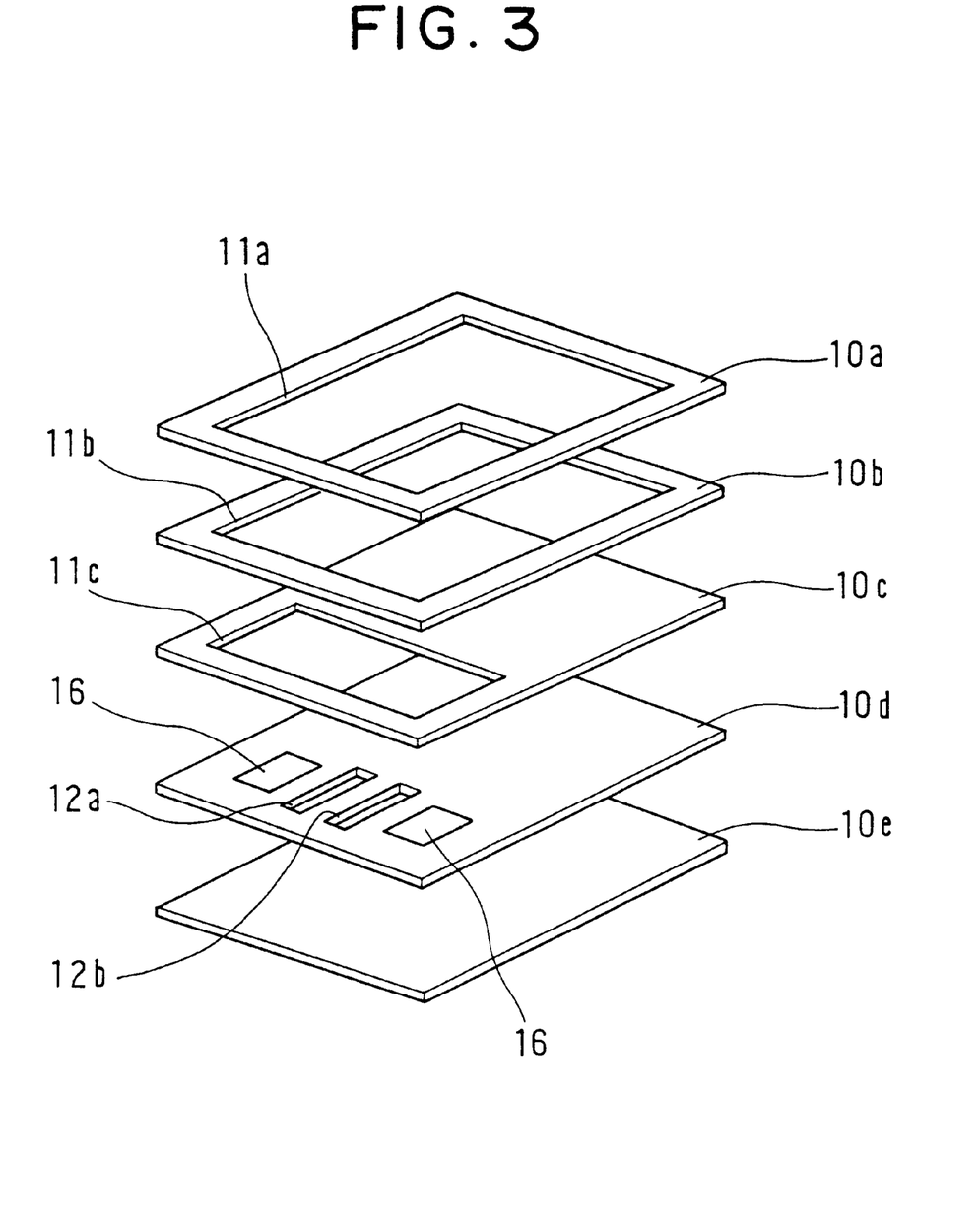
FIG. 3 is a perspective view of a ceramic package showing individual ceramic sheets before firing.
Figure 4:
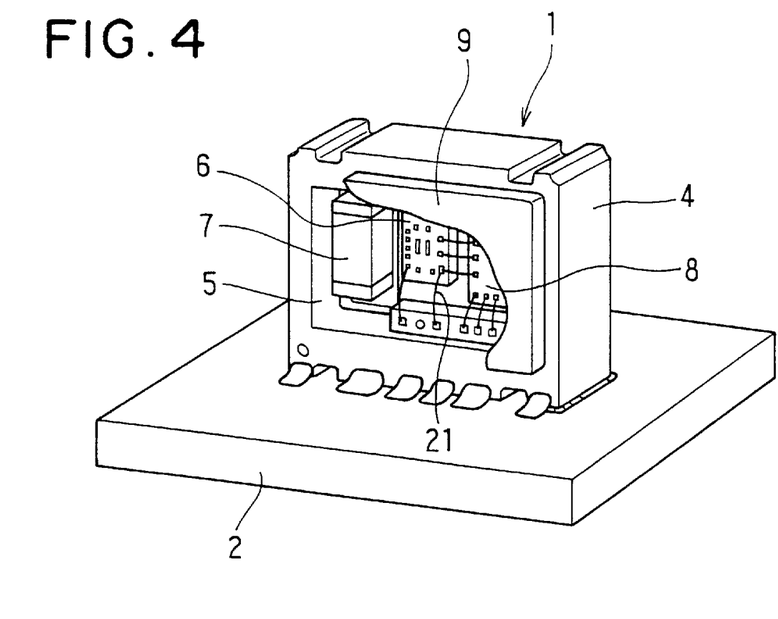
FIG. 4 is a perspective view showing the sensor module mounted on a printed board according to the present invention.

In FIG. 4, the acceleration sensor module 1 mounted on a printed board 2, which is for use in an air bag system in an automotive vehicle, is shown, and in FIGS. 1 and 2, cross-sectional views of the sensor module 1 are shown. A wiring conductor pattern 3 is formed on outer portions of the sensor module 1 as shown in FIGS. 1 and 2, and is connected, electrically and mechanically, to a corresponding conductor pattern printed on the board 2 by soldering. The sensor module is composed of a ceramic package 4 which constitutes a housing for containing electronic components therein; an acceleration sensor chip 6, a chip condenser 7, a controlling IC chip 8 and other components all surface-mounted in a cavity 5 of the ceramic package 4; and a cap 9 which hermetically seals the cavity 5. The ceramic package 4 is composed of a plurality of ceramic sheets 10a to 10e laminated on each other. FIG. 3 shows individual ceramic sheets 10a to 10e which are still green sheets before firing. On each of the ceramic green sheets, respective patterns are formed as shown in FIG. 3. On the ceramic green sheets 10a, 10b and 10c, openings 11a, 11b and 11c which form the cavity 5 are formed. The openings 11a and 11b are large to define an opening of the cavity 5, and the opening 11c of the sheet 10c has a size corresponding to an outer dimension of a chip condenser 7. The ceramic sheet 10d has slits 12a and 12b for mounting the chip condenser 7. Also, on the ceramic sheets, respective through-holes 13 are formed as shown in FIGS. 1 and 2 (not shown in FIG. 3) and respective tungsten films 16 (as shown on the sheet 10d in FIG. 3 as an example) on which wiring conductor patterns 14 and bonding conductor patterns 15 are formed in later processes are printed with a certain thickness (e.g., about 15 μm). The tungsten film is also formed in the through-holes to make electrical connections. The green ceramic sheets thus made are pressed and laminated on each other and fired to form the ceramic package 4 as a single body. On the tungsten films 16 which are exposed to the outside of the fired ceramic package 4, the wiring conductor patterns 14 and the bonding conductor patterns 15 are formed. The wiring conductor patterns 14 make electrical connections between the components in the cavity 5 and the outside of the ceramic package through the tungsten films in the through-holes. The bonding conductor patterns 15 is for electrically connecting the sensor chip 6 and the controlling IC chip 8 thereto by bonding wires 21.

Figure 6:
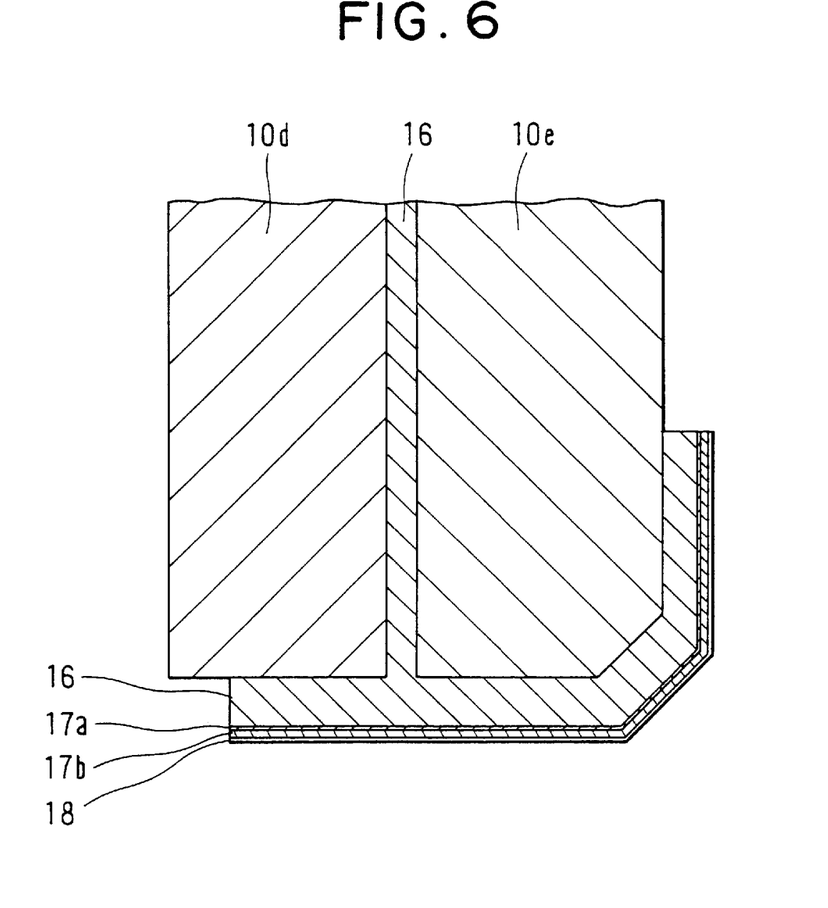
FIG. 6 is a partially enlarged cross-sectional view showing a conductor pattern of a first embodiment according to the present invention.

The wiring and bonding conductor patterns 14 and 15, as shown in FIG. 6 for example, are formed at the outside corner of the ceramic package, and consist of the tungsten (W) film 16 which serves as a base metal, a nickel (Ni) film consisting of a first nickel film 17a of Ni—B and a second nickel film 17b of Ni—P, and a gold (Au) film 18. The Ni—B, Ni—P and Au films are plated on the W film in this order. The first nickel film 17a is formed by electroless plating of Ni—B with a thickness of about 0.6~1.2 μm. The Ni—B film makes a good contact with the W film and adheres to it firmly. The second nickel film 17b is formed by electroless plating of Ni—P with a thickness of 4 μm or more. Conventionally, the nickel film has been formed with a thickness of about 2 μm. This thickness is not enough to sufficiently smooth the surface of the W base film, resulting in poor bonding quality sometimes.

The reason why the nickel film 17 is divided into two films 17a and 17b in the present invention is as follows. Though the first nickel film (Ni—B) 17a makes a good contact with the W base film, the Ni—B film is relatively hard and it is technically difficult to make its thickness more than 1.2 μm. If there is provided on the W film only the first nickel film which is not thick enough to smooth the W film surface, a sufficient quality of bonding can not be obtained. To obtain a nickel film thickness which is enough to smooth the W film surface, the second nickel film 17b (Ni—P), which is relatively soft and can be formed with a sufficient thickness, is provided on the first nickel film 17a (Ni–B).

The Au film 18 is formed on the second nickel film 17b by substitution-type flash plating with a thickness of 0.07~0.3 μm, preferably 0.1~0.2 μm. In the case where the substitution-type Au flash plating is applied to a printed board, e.g., a printed board for use in a chip-on-board structure, the plating is generally performed for about 5 minutes to make an Au film having a thickness of about 0.03 μm. The substitution-type Au flash plating of the present embodiment, however, is performed for about 20~40 minutes to make a thicker film. The longer operation of the plating process not only makes the film thicker but improves the film quality to have a denser structure.

It is considered that if thickness of the Au flash plating is thin like 0.03 μm, the Au film does not cover the nickel film surface sufficiently because the Au material is only scattered on the nickel film. Therefore, sufficiently high solder wettability cannot be obtained. When the Au flash plating is thicker than 0.07 μm as in the embodiment of the present invention, the surface of the nickel film is substantially covered by the Au film, thereby attaining good solder wettability. The nickel film surface not covered by the Au film is easily oxidized. On the other hand, if the Au film is thicker than 0.3 μm, the nickel film surface is completely covered by the Au film, leaving no nickel surface exposed. In a bonding process, e.g., a bonding process of the chip condenser, however, a small oxidized surface exposed helps to make a good bonding. Therefore, in case all the nickel film surface is covered by the Au film, a sufficient bonding strength on the Au film may not be obtained. This is proved by the fact that a sufficiently high bonding strength has not been obtained in the case where the reduction-type thick Au plating film having a thickness of 1 μm is used as a bonding surface. In addition, it is not easy to make an Au film thicker than 0.3 μm by the flash plating process at the present time. For the reasons mentioned above, the Au film thickness in the present embodiment has been chosen in the range from 0.07 μm to 0.3 μm.

Referring to FIGS. 1 and 2, surface-mounting of components in the cavity 5 will be explained. The condenser 7 is mounted on the conductor pattern 14 formed on the ceramic sheet 10d and connected electrically and mechanically thereto with silicone-type silver (Ag) paste 19. The condenser 7 is mounted on and connected to the conductor 14 on the sheet 10d, as shown in FIG. 1, at both terminals of the condenser. The condenser 7 is bonded to the conductor 14 with a sufficient bonding strength, because the conductor 14 has a surface covered by the Au film having a thickness of 0.07~0.3 μm, to the surface of which the oxidized nickel film is partly exposed as mentioned above. The slits 12a and 12b made on the ceramic sheet prevent the Ag paste supplied to both terminals from spreading and contacting each other. Also, the slits 12a and 12b make a creeping distance between both terminals longer. Therefore, a sufficient amount of the Ag paste 19 which is enough to secure a bonding strength can be used.

The semiconductor acceleration sensor chip 6 and the controlling IC chip 8 are mounted on and connected to the ceramic sheet 10c by die-bonding with a silicone-type die-bonding material 20. Then, the Ag paste 19 and the bonding material 20 are hardened at the same time.

The sensor chip 6 and the IC chip 8 are electrically connected to each other and to the bonding conductor pattern 15 formed on the ceramic sheet 10b with the bonding wires 21. The bonding wire 21 is an aluminum wire, a gold wire or the like.

As the last process, a cap 9 is mounted on the ceramic package 4 to close the opening and hermetically seal the cavity 5. Before mounting the cap 5 on the ceramic package, a sealing material 22 such as glass having a low melting temperature, high temperature solder or the like is printed on the sealing portion of the cap 9. The cap 9 is placed at a predetermined position with a jig and the whole ceramic package is heated to harden the sealing material 22 at a temperature of about 300° C. Thus, the acceleration sensor module 1 is completed.

Figure 5:
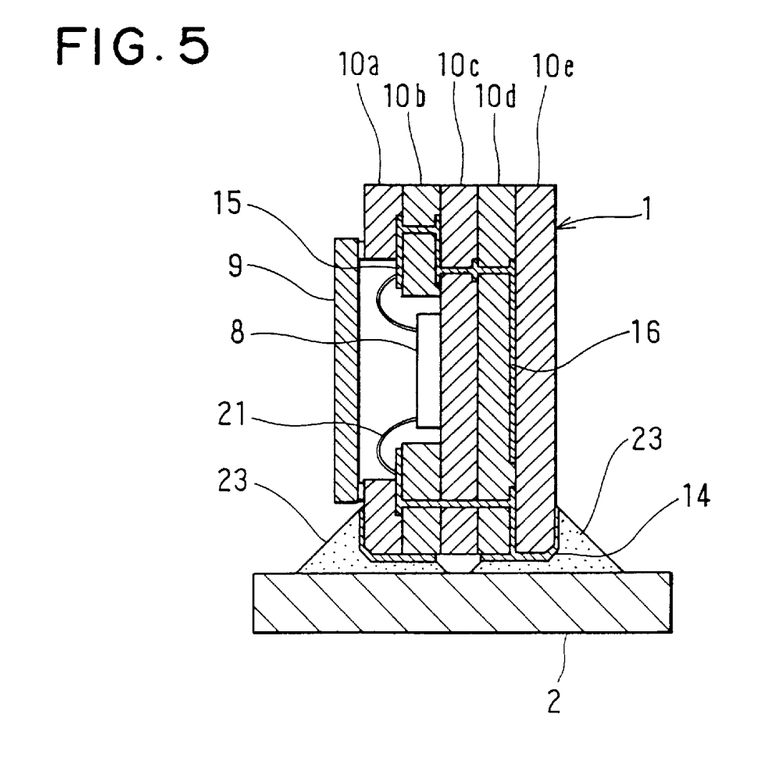
FIG. 5 is a cross-sectional view of the sensor module mounted on the printed board.

As shown in FIGS. 4 and 5, the acceleration sensor module 1 is mounted on the printed board 2 by soldering, e.g., reflow soldering with solder 23 together with other components to be mounted on the board. The sensor module 1 is mounted on the printed board 2 perpendicularly thereto, and electrically and mechanically connected to the printed board 2 at portions where the conductor patterns are formed.

Figure 7A:
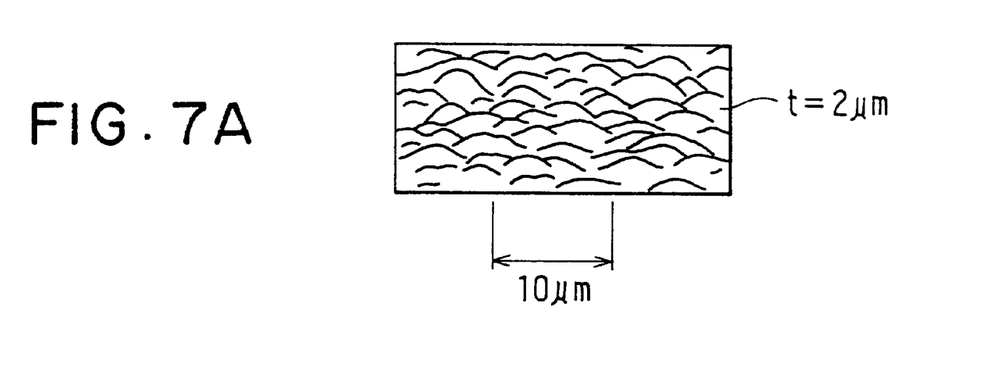
FIGS. 7A, 7B and 7C are schematic drawings showing surface roughness of a Ni—P plated film having various thicknesses.
Figure 10:
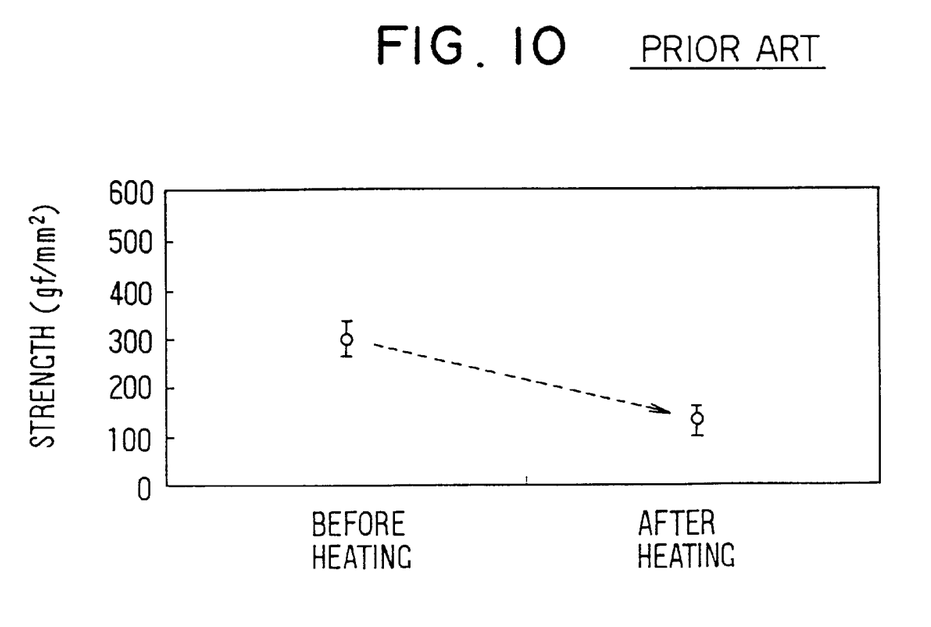
FIG. 10 is a graph showing bonding strength of the Ag paste on a reduction-type Au plating conventionally used.
Figure 11:
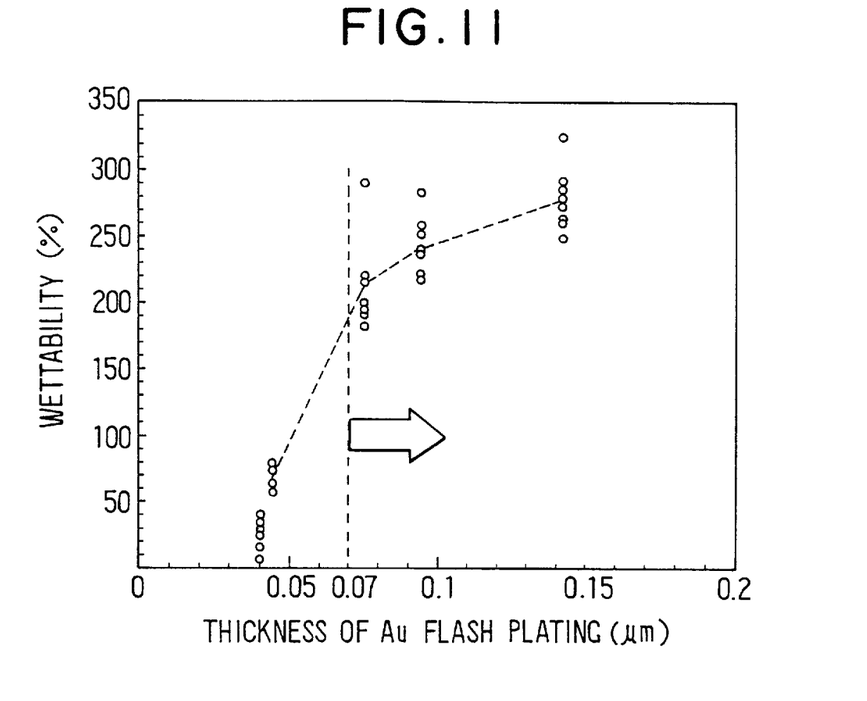
FIG. 11 is a graph showing wettability of solder placed on the substitution-type Au flash plating having various thicknesses.
Figure 12:
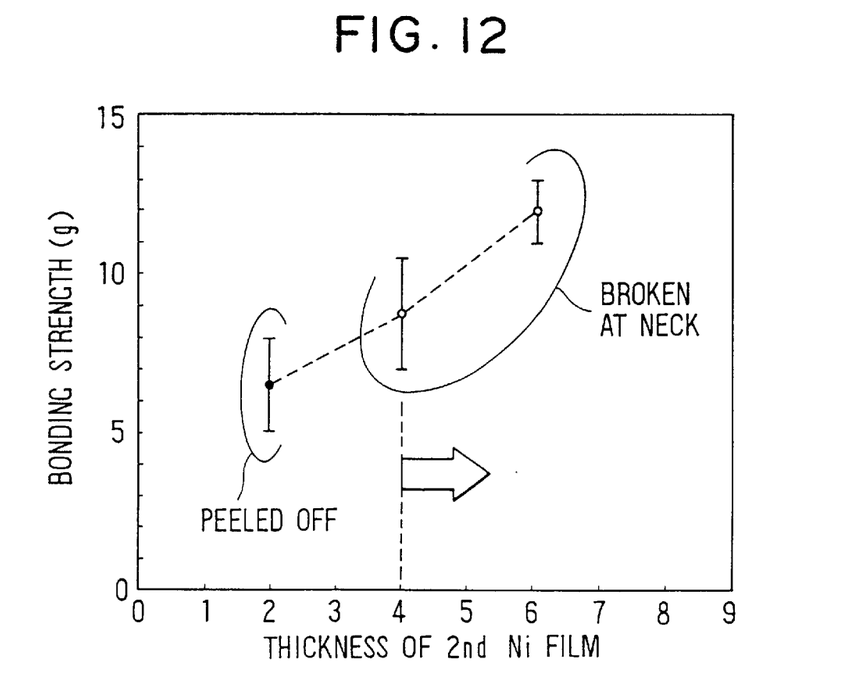
FIG. 12 is a graph showing a bonding strength of a bonding wire on the Au flash plating under which an Ni—P plating having various thicknesses is formed.

Referring to FIGS. 7A, to 12, features of the sensor module 1 will be explained with regard to the following aspects: 1) The second nickel film 17b is formed by Ni—P plating with a thickness of 4 μm or more, 2) the Au film is formed by substitution-type flash plating with a thickness in a range from 0.07 μm to 0.3 μm, and 3) the chip condenser 7 is bonded with silicone-type Ag paste.

Figure 7B:
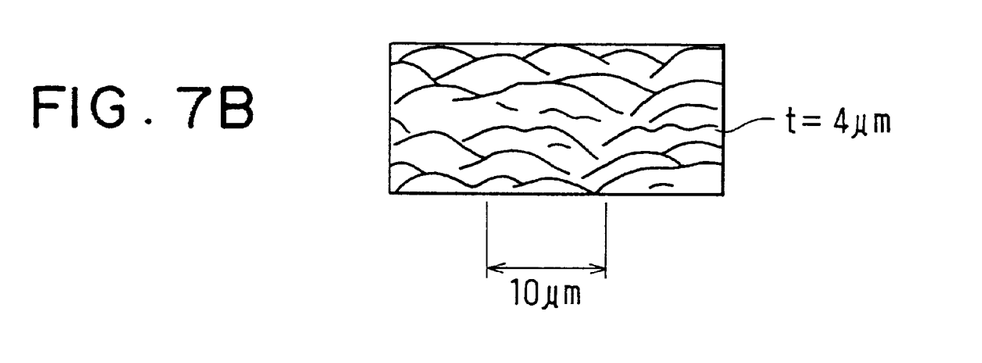
Figure 7C:
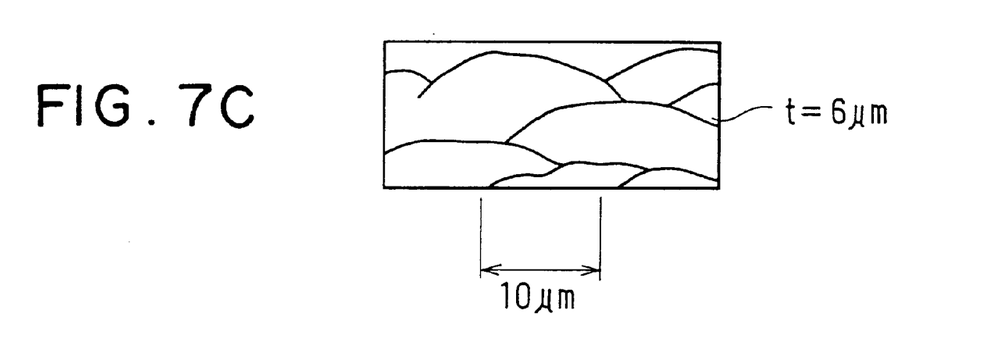
Figure 8:
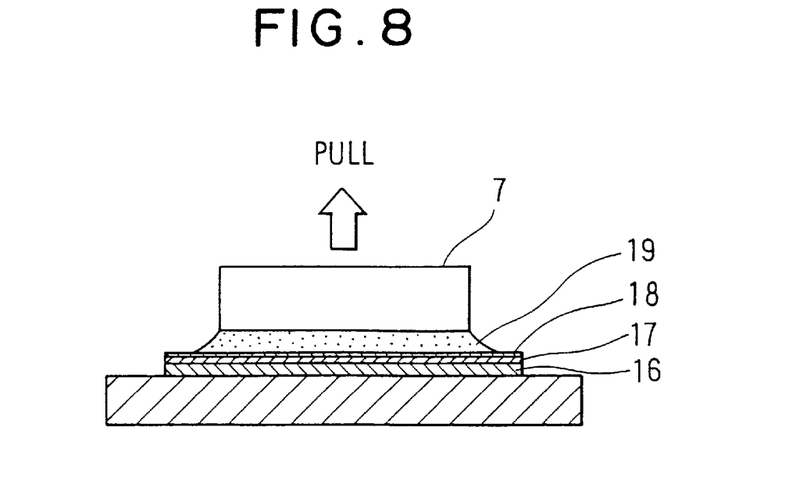
FIG. 8 is a cross-sectional view showing a test piece for testing a bonding strength of silicone-type Ag paste.

First, features of the present invention as to the first aspect will be explained. To achieve a sufficient bonding strength in a wire bonding process to electrically connect the semiconductor sensor chip 6 and the controlling IC chip 8 to the bonding conductor pattern 15, the Au film surface of the bonding conductor pattern 15 has to be smooth. The surface roughness of the Au film 18 greatly depends on the surface roughness of the second nickel film 17b on which the Au film 18 is plated. Further, the surface roughness of the second nickel film 17b depends on the thickness thereof. FIGS. 7A to 7B show schematic views of the surface roughness of the second nickel film 17b having different thickness. The surface of the second nickel film 17b is observed through a scanning electron microscope in a slanted direction and drawn into schematic drawings shown in FIGS. 7A to 7C. An average diameter of the grains of the W film 16 is 1.6 μm in these sample films. FIG. 7A shows the surface roughness of the second nickel film 17b plated with a thickness of 2 μm, FIG. 7B with a thickness of 4 μm and FIG. 7C with a thickness of 6 μm. As observed from the drawings, a size of the grains on the surface becomes larger and the surface becomes smoother, as the thickness becomes thicker. With a thickness of 6 μm, the surface is substantially plane.

Test bonding was performed on these sample surfaces, the results of which are shown in FIG. 12. In FIG. 12, the bonding strength is shown on the ordinate, measured for the second nickel film 17b (Ni—P) having various thickness shown on the abscissa. When the second nickel film is 2 μm thick, the bonding strength is low and, moreover, the bonded portions are peeled off. When the second nickel film is 4 μm thick and 6 μm thick, the bonding strength is high and the bonded portions are not peeled of f but the bonding wires are broken at the bonded neck thereof. Judging from those results, junctions made by bonding are sufficiently strong when the second nickel film is thicker than 4 μm.

Secondly, features of the present invention as to the second aspect will be explained. Although an Au film is usually formed by reduction-type thick plating, the Au film 18 of the present embodiment is formed by substitution-type flash plating. The thickness of the Au film 18 used in the present embodiment is much thinner than that of an Au film formed by a usual thick plating. Also, the plating solution used for the flash plating is inexpensive compared with the solution used for the thick plating. As shown in FIG. 11, in the case of the Au film formed by the substitution-type flash plating, a sufficient solder wettability higher than 200%, which is comparable to that of the Au film formed by thick plating with usual thickness of 1 μm, is obtained if the thickness thereof is thicker than 0.07 μm. The thicker the Au film becomes, the higher the wettability becomes. As a reason for this, it is considered that Au atoms become more densely accumulated as the thickness of the film increases.

The solder wettability is measured as follows. A solder ball having a diameter of a, for example, 4 mm, is placed on a surface of a specimen and then it is heated. The solder ball spreads on the surface with dimensions x in one direction and y in the other direction perpendicular to the former. The solder wettability is expressed in an equation:

$$\text{wettability } (\%) = \{(x-a)+(y-a)\} / 2a + 100$$

Moreover, in the case where the Au film formed by the substitution-type flash plating is used, Kirkendall voids are not formed in the film as opposed to the case where the conventional thick Au film having a thickness of about 1 μm is used. This is because all the Au atoms in the thin Au film formed by the flash plating diffuse into the solder contacting the Au film. This also contributes to improving the reliability of soldered junctions.

Figure 9:
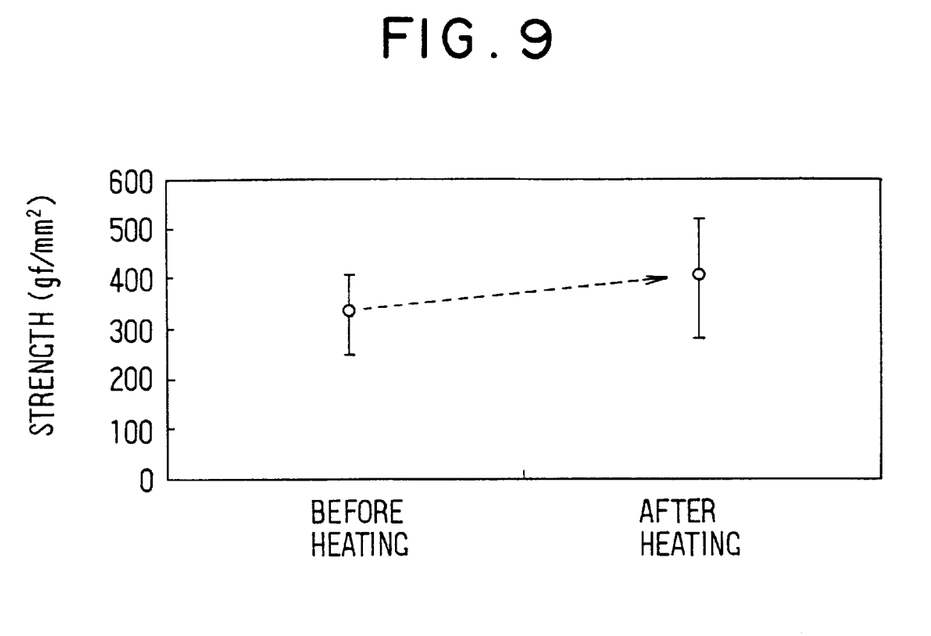
FIG. 9 is a graph showing bonding strength of the Ag paste on a substitution-type flash Au plating according to the present invention.

Thirdly, features of the present invention with respect to the third aspect will be explained. The chip condenser 7 is bonded to the ceramic sheet with silicone-type Ag paste 19. The bonding strength and the weight of the paste 19 do not decrease when the whole sensor module 1 is heated at a temperature higher than 300° C. to cure the sealing material 22 in the sealing process of the cap 9, because the Ag paste 19 is a heat resistible material. Also, the Ag paste 19 can be cured together with the die-bonding material 20 after all the components are mounted in the cavity 5, because both Ag paste 19 and die-bonding material 20 are made of the same base material. Generally, the bonding strength of the Ag paste on the Au film is not high. In this embodiment, however, because the Au film is formed by the substitution-type flash plating, it has been proved that a sufficient bonding strength can be obtained, as shown in FIGS. 9 and 10. FIG. 9 shows the bonding strength of the Ag paste 19 on the Au film formed by the substitution-type flash plating, while FIG. 10 shows the same on the conventional thick Au film formed by the reduction-type thick plating. The bonding strength shown in the graphs is measured using a specimen shown in FIG. 8. As seen in FIG. 9, the bonding strength of the Ag paste does not decrease even after the specimen is heated at 360 ° C., rather it shows a tendency to increase a little. On the other hand, the bonding strength of the Ag paste on the conventional Au film, as seen in FIG. 10, substantially decreases after it is heated at 360 ° C. This may result from the Au atom density difference between the conventional thick Au film and the Au film formed by the flash plating, and from an influence of impurities on the surface of the Au films.

In the first embodiment described above, an excellent surface-mounting of electronic components on the ceramic package is secured, because the wiring and bonding conductor patterns 14 and 15 are formed by plating the first nickel film 17a (Ni—B) with a thickness of 0.6~1.2 μm, the second nickel film 17b (Ni—P) with a thickness of more than 4 μm and the flash gold film 18 (Au) with a thickness of 0.07~0.3 μm on the base film 16 (W) in this order.

The material of the base film 16 which is tungsten (W) in the first embodiment may be replaced by molybdenum (Mo). Though molybdenum is more expensive than tungsten, it may be worthwhile to use molybdenum in the case where higher reliability is required, because molybdenum has more advantageous characteristics than tungsten in various aspects. First, a melting temperature of molybdenum (in a state of paste) is about 2400° C. which is much lower than that of tungsten, i.e., about 3200° C. A melting temperature of alumina which is a base material of ceramics is about 2000° C. Therefore, when molybdenum is used in place of tungsten, the ceramic package 4 can be fired at a lower temperature. Secondly, because a shrinkage rate of molybdenum at firing is close to that of ceramics, it is easy to control firing conditions. Thirdly, because a specific resistance of molybdenum is about 0.5 Ω-cm and is much lower than that of tungsten which is about 5.3 Ω-cm, it is advantageous to use molybdenum in respect of electrical resistance.

Figure 13:
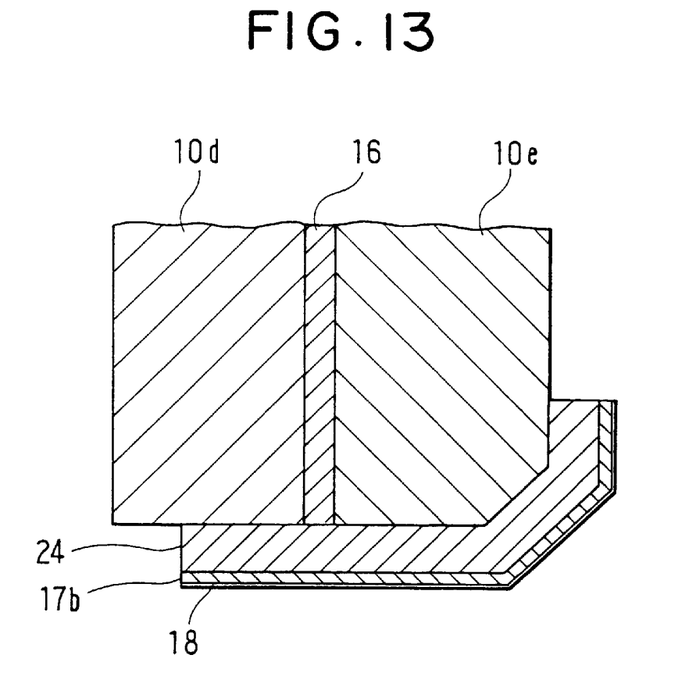
FIG. 13 is a partially enlarged cross-sectional view showing a conductor pattern of a second embodiment according to the present invention.

Now, referring to FIG. 13, a second embodiment according to the present invention will be explained. In this embodiment, the material forming the base film of the wiring and bonding conductor patterns 14 and 15, which is tungsten (W) in the first embodiment, is replaced with copper (Cu). Tungsten conductors 16 formed in through-holes 13 and between ceramic sheets are not replaced. As an example of the conductor patterns 14 and 15, a conductor pattern formed on an outside of the ceramic package is shown in FIG. 13. The conductor pattern is composed of a copper film 24 having a thickness of about 15 μm formed on the ceramic sheets 10e and 10d, a nickel film 17b made of Ni—P plating plated on the copper film 24, and a gold film 18 plated on the nickel film 17b by flash plating. In the second embodiment, the first nickel film 17a is eliminated because the second nickel film 17b made of N—P makes a good contact with the copper film 24. Also, because the surface of the copper film 24 can be made smoother than that of the tungsten film in the first embodiment, the thickness of the second nickel film 17b in the second embodiment is not necessary to be thick as in the first embodiment. Good wire bonding can be secured with its thickness of about 2 μm or more.

Figure 14:
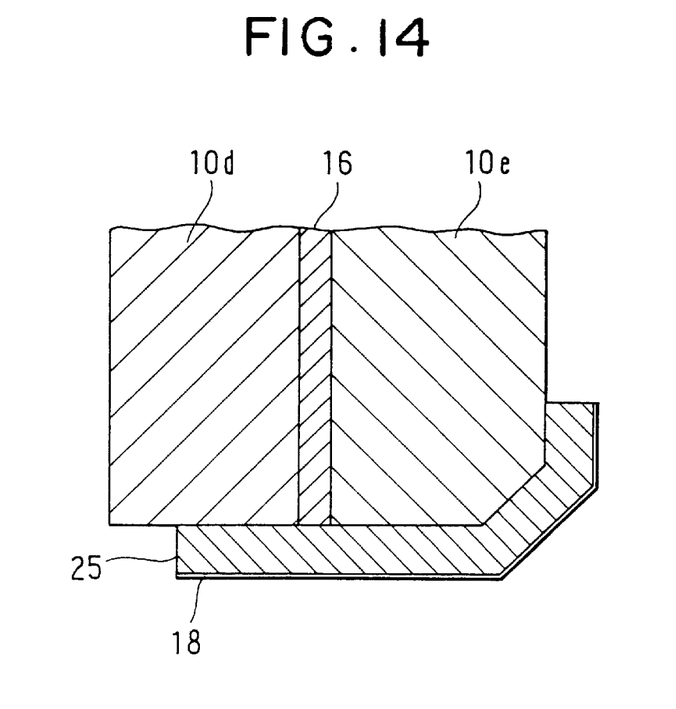
FIG. 14 is a partially enlarged cross-sectional view showing a conductor pattern of a third embodiment according to the present invention.

A third embodiment according to the present invention will be explained referring to FIG. 14. In this embodiment, the copper film 24 of the second embodiment is replaced with a film 25 made of silver (Ag) or a silver alloy, such as silver-palladium (Ag—Pd), silver-platinum (Ag—Pt) or the like. The silver or silver alloy film 25 is plated on the ceramic sheets 10d and 10e with a thickness of about 10 μm or more. Because the surface of the silver or silver alloy film 25 can be made much smoother than that of tungsten, molybdenum or copper, the nickel film 17 can be totally eliminated. The gold film 18 is directly plated on the base film 25 by flash plating. In this embodiment, the base film 25 is more expensive because silver is used, but on the other hand the process for forming the conductor patterns can be simpler because the nickel film is eliminated.

The ceramics used in the ceramic package in the foregoing embodiments may be replaced with liquid crystal polymer or the like.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A structure for mounting electronic components comprising:

a housing;

conductor patterns formed on the housing;

a gold flash plating on a surface of the conductor patterns with a thickness of 0.007 μm–0.3 μm; and electronic components bonded on the conductor patterns with a bonding material and connected to the conductor patterns.

2. A structure for mounting electronic components according to claim 1, wherein the housing is composed of a plurality of ceramic sheets.

3. A structure for mounting electronic components according to claim 1, wherein the conductor patterns having the gold flash plating on the surface thereof further include a base film of tungsten and an intermediate film of nickel, the intermediate film being plated on the base film and the gold flash plating being formed on the intermediate film.

4. A structure for mounting electronic components according to claim 1, wherein the electronic components include a semiconductor chip.

5. A structure for mounting electronic components according to claim 1, wherein the electronic components include a semiconductor acceleration sensor chip.

6. A structure for mounting electronic components according to claim 1, wherein the electronic components include an element which is to be both mechanically and electrically connected to the conductor patterns, and the element is bonded to the conductor patterns with the bonding material of silicone-type silver plate.

7. A structure for mounting electronic components according to claim 1, wherein the conductor patterns having the gold flash plating on the surface thereof further include a base film of molybdenum and an intermediate film of nickel, the intermediate film being plated on the base film and the gold flash plating being formed on the intermediate film.

8. A structure for mounting electronic components according to claim 1, wherein the conductor patterns having the gold flash plating on the surface thereof further include a base film of copper and an intermediate film of nickel, the intermediate film being plated on the base film and the gold flash plating being formed on the intermediate film.

9. A structure for mounting electronic components according to claim 1, wherein the conductor patterns having the gold flash plating on the surface thereof further include a base film of silver or a silver alloy such as silver-palladium or silver-platinum, the gold flash plating being formed on the intermediate film.

10. A structure for mounting electronic components according to claim 3, wherein the intermediate film of nickel has a thickness more than 4 μm.

11. A structure for mounting electronic components according to claim 3, wherein the intermediated film of nickel is composed of a first nickel film formed by nickel-boron plating using boron as a catalyst and a second nickel film formed by nickel-phosphorus plating using phosphorus as a catalyst, both films being plated on the base film of tungsten in this order.

12. A structure for mounting a housing containing electronic components therein comprising:

a housing;

conductor patterns formed on the housing;

a gold flash plating on a surface of the conductor patterns with a thickness of 0.07 μm–0.2 μm; and a base board for mounting the housing thereon, the housing being soldered on the base board and electrically connected thereto at portions where the conductor patterns are formed.

13. A structure for mounting a housing containing electronic components therein according to claim 12, wherein the conductor patterns further include a base film of tungsten plated on the housing and an intermediate film of nickel plated on the base film, the gold flash plating being formed on the intermediate film.

14. A structure for mounting a housing containing electronic components therein according to claim 12, wherein the conductor patterns further include a base film of molybdenum plated on the housing and an intermediate film of nickel plated on the base film, the gold flash plating being formed on the intermediate film.

15. A structure for mounting a housing containing electronic components therein according to claim 12, wherein the conductor patterns further include a base film of copper plated on the housing and an intermediate film of nickel plated on the base film, the gold flash plating being formed on the intermediate film.

16. A structure for mounting a housing containing electronic components therein according to claim 12, wherein the conductor patterns further include a base film of silver or a silver alloy plated on the housing, the gold flash plating being formed on the base film.

17. A structure for mounting a housing containing electronic components therein according to claim 13, wherein the thickness of the intermediate nickel film is more than 4 μm.

18. A structure for mounting a housing containing electronic components therein according to claim 13, wherein the intermediate nickel film is composed of a first nickel film formed by nickel-boron plating using boron as a catalyst and a second nickel film formed by nickel-phosphorus plating using phosphorus as a catalyst, both films being plated on the base film of tungsten in this order.

19. A structure for mounting electronic components comprising:

a housing;

conductor patterns formed on the housing;

a gold flash plating on a surface of the conductor patterns with a thickness of more than 0.07 μm; and electronic components bonded on the conductor patterns with a bonding material and connected to the conductor patterns;

wherein the conductor patterns having the gold flash plating on the surface thereof further include a base film of tungsten and an intermediate film of nickel, the intermediated film being plated on the base film and the gold flash plating being formed on the intermediate film.

20. A structure for mounting electronic components according to claim 19, wherein the intermediate film of nickel has a thickness more than 4 μm.

21. A structure for mounting electronic components according to claim 19, wherein the intermediate film of nickel is composed of a first nickel film formed by nickel-boron plating using boron as a catalyst and a second nickel film formed by nickel-phosphorus plating using phosphorus as a catalyst, both films being plated on the base film of tungsten in this order.

22. A structure for mounting electronic components comprising:

a housing;

conductor patterns formed on the housing;

a gold flash plating on a surface of the conductor patterns with a thickness of more than 0.07 μm; and electronic components bonded on the conductor patterns with a bonding material and connected to the conductor patterns;

wherein the conductor patterns having the gold flash plating on the surface thereof further include a base film of molybdenum and an intermediate film of nickel, the intermediate film being plated on the base film and the gold flash plating being formed on the intermediate film.

23. A structure for mounting a housing containing electronic components therein comprising:

a housing;

conductor patterns formed on the housing;

a gold flash plating on a surface of the conductor patterns with a thickness of more than 0.07 μm; and a base board for mounting the housing thereon, the housing being soldered on the base board and electrically connected thereto at portions where the conductor patterns are formed;

wherein the conductor patterns further include a base film of tungsten plated on the housing and an intermediate film of nickel plated on the base film, the gold flash plating being formed on the intermediate film.

24. A structure for mounting a housing containing electronic components therein according to claim 23, wherein the thickness of the intermediate nickel film is more than 4 μm.

25. A structure for mounting a housing containing electronic components therein according to claim 23, wherein the intermediate nickel film is composed of a first nickel film formed by nickel-boron plating using boron as a catalyst and a second nickel film formed by nickel-phosphorus plating using phosphorus as a catalyst, both films being plated on the base film of tungsten in this order.

26. A structure for mounting a housing containing electronic components therein comprising:

a housing;

conductor patterns formed on the housing;

a gold flash plating on a surface of the conductor patterns with a thickness of more than 0.07 μm; and a base board for mounting the housing thereon, the housing being soldered on the base board and electrically connected thereto at portions where the conductor patterns are formed;

wherein the conductor patterns further include a base film of molybdenum plated on the housing and an intermediate film of nickel plated on the base film, the gold flash plating being formed on the intermediate film.

* * * * *

UNITED STATES PATENT AND TRADEMARK OFFICE
CERTIFICATE OF CORRECTION

PATENT NO. : 5,898,218
DATED : April 27, 1999
INVENTOR(S) : HIROSE

It is certified that error appears in the above-identified patent and that said Letters Patent is hereby corrected as shown below:

On the title page, item [75] should read:

Inventor:   Shinichi Hirose, Okazaki, Japan   [73] Assignee:   DENSO CORPORATION, Kariya-city, Japan
                            KYOCERA CORPORATION, Kyoto, Japan Signed and Sealed this First Day of February, 2000

Attest:

Q. TODD DICKINSON

*Attesting Officer*     *Acting Commissioner of Patents and Trademarks*